(12) United States Patent
Hansen

(10) Patent No.: US 6,239,393 B1
(45) Date of Patent: May 29, 2001

(54) CONTACT DEVICE AND A TOOL FOR HANDLING IT

(75) Inventor: Kaj Børge Hansen, Horsens (DK)

(73) Assignee: Kirk Acoustics A/S, Horsens (DK)

(*) Notice: Subject to any disclaimer, the term of this patent is extended or adjusted under 35 U.S.C. 154(b) by 0 days.

(21) Appl. No.: 09/381,091

(22) PCT Filed: Mar. 26, 1998

(86) PCT No.: PCT/DK98/00126

§ 371 Date: Oct. 7, 1999

§ 102(e) Date: Oct. 7, 1999

(87) PCT Pub. No.: WO98/43317

PCT Pub. Date: Oct. 1, 1998

(30) Foreign Application Priority Data

Mar. 26, 1997 (DK) .................................................. 357/97

(51) Int. Cl.[7] .................................................. H01H 1/06
(52) U.S. Cl. .................................................. 200/276; 361/288
(58) Field of Search .................................................. 200/5 A, 517, 200/520, 341, 344, 345; 400/490, 494, 491, 495, 495.1, 496

(56) References Cited

U.S. PATENT DOCUMENTS

| | | |
|---|---|---|
| 3,205,402 | 9/1965 | Zeller . |
| 3,781,497 | * 12/1973 | Stephenson et al. ............. 200/61.58 |
| 3,842,230 | 10/1974 | Kashio et al. . |
| 4,458,293 | 7/1984 | Cherry . |
| 4,678,880 | 7/1987 | Koizumi et al. . |
| 4,733,036 | 3/1988 | Koizumi et al. . |
| 4,831,223 | 5/1989 | Wako . |
| 5,111,009 | * 5/1992 | Chan et al. ............................ 200/330 |
| 5,158,357 | * 10/1992 | McDermott ............................ 362/204 |
| 5,173,578 | * 12/1992 | Tama .................................... 200/345 |

FOREIGN PATENT DOCUMENTS

| | | |
|---|---|---|
| 41 27 696 A1 | 2/1993 | (DE) . |
| 0 141 305 A2 | 5/1985 | (EP) . |
| 0 616 395 A1 | 9/1994 | (EP) . |
| 0 755 165 A1 | 1/1997 | (EP) . |
| WO 96/00994 | 1/1996 | (WO) . |

* cited by examiner

Primary Examiner—Lincoln Donovan
Assistant Examiner—Nhung Nguyen
(74) Attorney, Agent, or Firm—Oliff & Berridge, PLC

(57) ABSTRACT

A contact device consisting of a helical spring which is adapted from SMD mounting, and which is formed with a base portion adapted to be positioned on and attached to a contact face by soldering or gluing, and with a top portion adapted for handling with a tool preferably associated with an SMD apparatus. This provides the possibility of achieving a generally better and less expensive contacting between components, such as acoustic transducers, batteries or the like and printed circuit boards by means of simple features. Constructing the contact device as a screw or helical spring provides a great safeguard against transfer of laterally directed forces or moments from the contact face which destroy the contact face and/or the solder connection with the printed circuit. A tool for handling the contact device consists of a preferably vacuum-driven mounting pick-up with a central control mandrel which fits internally in the top portion of the contact device, and which has an enclosing, ring-shaped recess adapted to the outer shape of the top portion of the contact device.

10 Claims, 2 Drawing Sheets

CONTACT DEVICE AND A TOOL FOR HANDLING IT

FIELD OF THE INVENTION

The present invention relates to a contact device comprising an electrically conducting helical spring, said helical spring being formed with a base portion to be positioned on and attached to a contact face by soldering or gluing, and formed with a top portion, and to a tool for handling the contact device.

For electrical contacting of separate components for printed electrical circuits it is known to provide the component with spring contacts, or to provide the circuit with a contact housing which contains the desired number of spring contacts to establish electrical connections. The spring contacts may be of different types, e.g. elastomer contacts either with carbon contact elements or gold wires. It is moreover known to provide differently constructed metal contacts or contact faces with a metal plating of superior conductivity or wear resistance.

It is known from EP-A1-0 755 165 to use a helical spring for contacting between a circuit board and an electroacoustic transducer, where the helical spring is firmly connected with the transducer outside the diaphragm face, i.e. where the transducer housing has a special protruding housing part in which a base part of the contact spring is secured.

U.S. Pat. No. 4,458,293 discloses an electrically conducting contact spring which, according to the document, may be wave soldered at a solder point. In its unstressed state the windings of that spring are open. A problem in connection with this spring is that it is not suitable for automatic handling in SDM mounting, since vacuum retention of the upper air permeable windings of the spring in a suction tool is difficult or directly impossible. It should be recalled in this connection that handling of very small contact springs of the above-mentioned type will be difficult if not impossible, as the springs with very small diameters and wire diameters will be extremely vulnerable to e.g. deformations caused by inexpedient adaptation of a necessary and sufficient vacuum suction.

The object of the invention is to provide a contact device of the type mentioned in the opening paragraph which makes it possible to achieve a generally better and less expensive contacting between separate components, such as acoustic transducers, batteries, etc. and printed circuit boards, by means of simple features.

SUMMARY OF THE INVENTION

The contact device according to the invention is characterized in that the top portion is adapted for SMD mounting, said helical spring being formed with a base part adapted to be positioned on and attached to a contact face by soldering or gluing, and formed with a top portion adapted for handling with a pneumatic tool, preferably associated with an SMD robot, said top portion having a predominantly cylindrical shape with two or more closely wound windings and having a plane top or contact face.

According to an advantageous embodiment, the top portion is formed with a winding diameter as small as possible with respect to the wire diameter, thereby achieving an increased air resistance.

By means of simple features it is hereby possible to obtain a generally better and less expensive mounting of contact springs for contacting between components, such as acoustic transducers, batteries or the like and printed circuit boards.

A further advantage of the invention is achieved in that the contact spring may be used in SMD tools at very high rates, since the springs may be handled at relatively small suction pressures because of the increased engagement face. This moreover results in a very small percentage of faulty mounting, as a relatively small suction pressure directed against a relatively fragile contact spring subjects the contact spring to a minimum of strain during handling.

Providing the top portion of the contact spring with a closed suction face formed by one of the windings thus enables the contact spring to be "gripped" by a vacuum suction, as the air resistance of the very small tube formed by the windings is so great that this provides a relatively great air resistance with respect to an enclosing part of a corresponding suction tool.

To enable simple and safe handling of the contact device according to the invention by means of simple vacuum pick-up, it may be advantageous that said top portion is given a predominantly cylindrical shape with one or more closely wound windings and has a plane top or contact face. The predominantly cylindrical top portion is important to achieve a sufficient contact face with the suction air along the outer side of the top portion. The plane top or contact face of the stable top portion may be relatively small, which reduces the necessary contact area on the component, thereby allowing its overall size to be minimized.

The longitudinal ratio of unaffected to affected contact device may be maximized according to the invention in that the helical spring has a conical shape between said top and base portions. The conical shape of the screw or helical moreover counteracts tipping over of the contact spring device during the soldering process.

It may also be advantageous that the contact device according to the invention is constructed such that, in addition to the top portion, the base portion has one or more closely wound, conical windings. In other words, it may be advantageous that the top portion as well as the base portion of the contact device has two or more closely wound windings having a pitch which corresponds to the wire diameter or slightly more than this, it being thereby possible to separate the contact devices in a vibrator feeder for positioning in tape and reel or in another standard package for feeding in an SMD mounting robot. Also a stabilization of the contact position of the contact device with respect to the soldering point is obtained.

Construction of the contact device as a screw or helical spring provides a great safeguard against transfer of laterally directed forces or moments from the contact force which destroy the contact face and/or the solder connection with the printed circuit.

The designation SMD (Surface Mounted Device) refers to components having one or more contact faces which are adapted or intended for direct connection soldering or optionally gluing) with contact points of circuit boards.

Expediently and according to the invention, with a view to ensuring a good and stable connection with the contact face of the circuit board, the contact device may alternatively be constructed such that said base portion is wound with one or more additional windings to form a wide base portion which is flush with the contact face and the soldering face.

A contact device according to the invention may e.g. be wound of spring wire with a thickness of the order of 0.2 mm, a top diameter of about 1.1 mm, a base portion with a diameter of about 2.4 mm, a winding spacing of about 0.5—0.5 mm and a free height of about 4 mm.

Or a contact device according to the invention may be wound of spring wire with a thickness of the order of 0.2 mm, a top diameter of about 1.1 mm, a base portion with a diameter of about 2.4 mm, a free height of about 2 mm, a compressed height of about 0.8 mm and a lower portion of great conicity. The actual thickness of the spring wire must be adapted to the actual spring size, of course.

The invention also relates to a tool for handling the contact device according to the invention, said tool being characterized in that it consists of a preferably vacuum driven mounting pick-up having a central control mandrel which fits loosely inside the top portion of the contact device, and which has an enclosing recess adapted to the external shape of the top portion of the contact device.

Preferably, the tool is moreover constructed such that said recess preferably has a greater depth than the length of the control mandrel and has a downwardly/outwardly increasing cross-section with an outer lip-shaped mouth. The tool can hereby grip and position a contact device more easily, if the cylindrical top portion is e.g. not positioned or oriented completely correctly with respect to the mouth of the tool.

However, it will be appreciated that the control mandrel may be omitted completely if the springs are shaped carefully.

Alternatively, the central control mandrel of the tool according to the invention may be provided with an external diameter which is slightly larger than the internal passage of the top portion of the contact device, said tool moreover comprising a slidable release part which encloses the control mandrel, and which may be activated to release the contact device.

The invention will be explained more fully below in connection with the drawing, in which.

Figure 1:
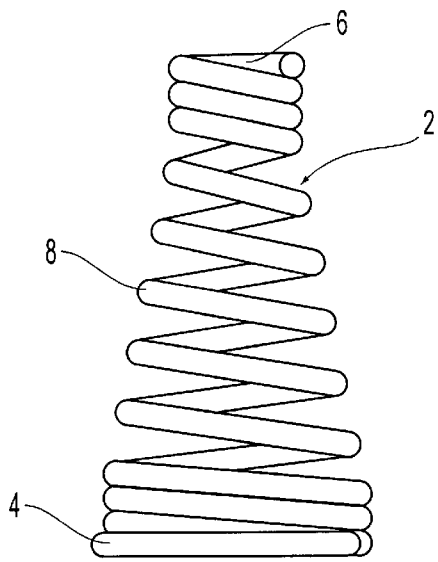
FIG. 1 is a lateral view of an embodiment of a contact device according to the invention.

FIG. 1 shows an embodiment of a contact device 2 according to the invention which is formed by a helical spring 2 having a helix axis and a base portion 4, having a second external winding diameter a top portion or first end portion 6 having a first external winding diameter and a conical intermediate portion 8. The contact device/helical spring 2 having a wire diameter is wound of spring wire having a thickness of 0.2 mm, and its overall unloaded height is about 4 mm; the base portion 4 has an external diameter of about 2.4 mm, and the top portion 6 has an external diameter of about 1.1 mm. The base portion 4 and the top portion 6 have a plurality of closely wound windings with the smallest possible winding diameter relative to the wire diameter, while the pitch between the windings of the intermediate portion 8 is 0.4–0.5 mm, i.e. the compressed helical spring 2 has a height of about 2.5 mm.

Figure 2:
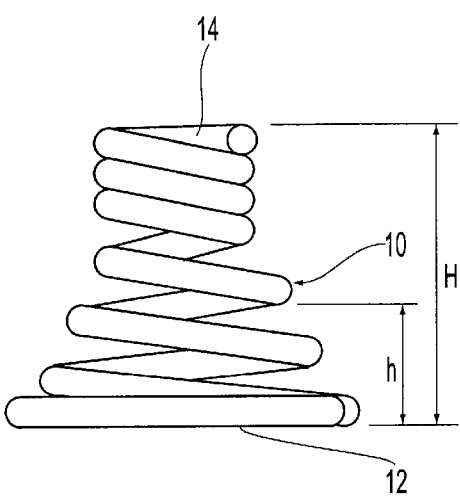
FIG. 2 is a lateral view of another embodiment of a contact device according to the invention.

FIG. 2 shows and embodiment of a contact device 10 according to the invention which is formed by a relatively short conical helical spring 10 having a wide base portion 12 and a top portion 14 which has a plurality of closely wound windings with the smallest possible diameter. Unloaded, the contact device 10 has an overall height (H) of about 2 mm; while its compressed height (h) is about 0.8 mm.

Figure 3:
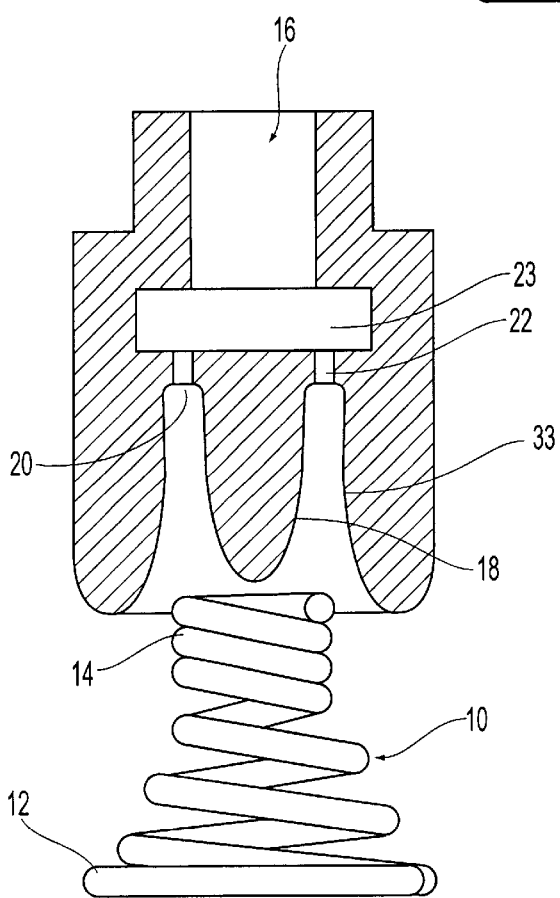
FIG. 3 is a lateral sectional view of an embodiment of a tool for handling the contact device according to the invention.

Both contact devices 2 and 10 have identical predominantly cylindrical top portions 6 and 14, so that the top portions have the appearance of outwardly closed predominantly cylindrical units that may be handled with a simple suction tool 16, which is shown in FIG. 3, and which e.g. belongs to a common SMD mounting robot. The suction tool 16 comprises a central mandrel 18 which—as shown—is adapted to be inserted into the top portion 14 of the spring contact 10, and which fits loosely in the top portion 14, and an enclosing recess 20 forming a suction cavity which is adapted to the outer shape of the top portion, and which is connected with a source of vacuum via bores 22 in the bottom of the recess 20 and a pressure reduction chamber 23. As will appear from FIG. 3, the recess 20 is formed by the central mandrel 18 and an enclosing engagement face 33 having an internal diameter and a flaring portion.

Figure 4:
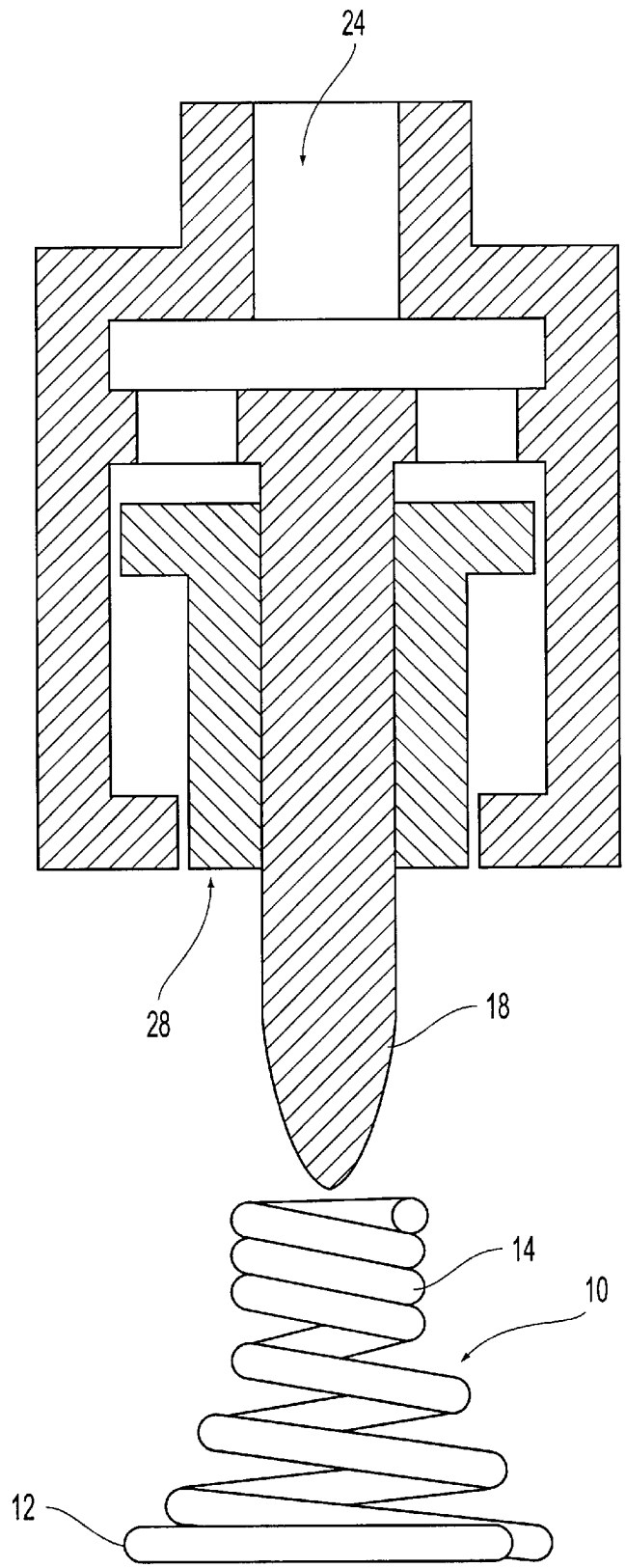
FIG. 4 is a lateral sectional view of another embodiment of a tool for handling the contact device according to the invention.

FIG. 4 shows an alternative tool 24 which comprises a central mandrel 18 having an external diameter which is slightly greater than the internal diameter of the top portion 6 and 14, i.e. the top portion 6 or 14 will be clamped externally on the mandrel 18 when this is inserted from above into the top portion 6 or 14. The tool 24 moreover comprises a polisher 28 which encloses the mandrel 18, and which may be displaced externally on it in order to polish the spring contact 2 or 10 when this is positioned correctly on contact points of a given circuit board.

It should moreover be stressed that the contact device according to the invention e.g. have the following basic advantages:

1) The total costs of the manufacture, storage and distribution of springs of several lengths and of components to be adapted to various mounting heights are lower than the costs of the manufacture, storage and distribution of components provided with springs of various lengths.

2) When the contact face is provided on the components rather than on the printed circuit, the necessary area with a safe (enhanced) contact surface is reduced to the very limited contact points of the component, whereby the printed circuit may have a less expensive plating.

3) As the micro contact (contact device) is attached to the printed circuit by soldering (or optionally gluing) without any housing, the contact device takes up a minimum of space, which also contributes to reducing the total costs.

What is claimed is:

1. A contact device comprising an electrically conducting and resilient wire with a predetermined wire diameter, the wire being formed as a helical spring with a helix axis, the helical spring having a first end portion including tow or more windings with a first external winding diameter, the two or more windings having, in an unstressed state of the contact device, a pitch, which corresponds to the wire diameter, the contact device further having, adjacent the first end portion, an intermediate portion including windings with winding diameters increasing from the first winding diameter to a second winding diameter greater than the first winding diameter.

2. A contact device according to claim 1, wherein the windings of the intermediate portion are spaced from each other.

3. A contact device according to claim 1, wherein the intermediate portion is substantially conical.

4. A contact device according to claim 1, wherein the first external winding diameter is no more than six times the wire diameter.

5. A contact device according to claim 1 further having a second end portion opposite the first end portion, the second end portion includes one or more windings defining a plan substantially perpendicular to the helix axis.

6. A contact device according to claim 5, wherein the second end portion include one or more windings having a pitch, which corresponds to the wire diameter.

7. A suction tool for handling a contact device according to claim 1, the tool having a suction cavity to receive the first end portion of the contact device, the cavity having a substantially cylindrical portion with an internal diameter corresponding to the external diameter of the first end portion of the contact device.

8. A tool according to claim 7 further including, in the suction cavity, a mandrel that fits loosely inside the first end portion of the contact device when received in the suction cavity.

9. A tool according to claim 7, wherein the suction cavity has a flaring portion having an opening with a cross section that is greater than a cross section of the substantially cylindrical portion of the suction cavity.

10. A tool according to claim 9, wherein the flaring portion is adapted to contact or more windings of the intermediate portion of the contact device when received in the suction cavity.

* * * * *